United States Patent
Heng

(10) Patent No.: US 12,227,871 B2
(45) Date of Patent: Feb. 18, 2025

(54) QUARTZ CRUCIBLE AND CRYSTAL PULLER

(71) Applicant: XI'AN ESWIN MATERIAL TECHNOLOGY CO., LTD., Xi'an (CN)

(72) Inventor: Peng Heng, Xi'an (CN)

(73) Assignee: XI'AN ESWIN MATERIAL TECHNOLOGY CO., LTD., Xi'an (CN)

( * ) Notice: Subject to any disclaimer, the term of this patent is extended or adjusted under 35 U.S.C. 154(b) by 0 days.

(21) Appl. No.: 18/570,788

(22) PCT Filed: Sep. 21, 2022

(86) PCT No.: PCT/CN2022/120213
§ 371 (c)(1),
(2) Date: Dec. 15, 2023

(87) PCT Pub. No.: WO2023/051348
PCT Pub. Date: Apr. 6, 2023

(65) Prior Publication Data
US 2024/0263343 A1    Aug. 8, 2024

(30) Foreign Application Priority Data
Sep. 30, 2021    (CN) .......................... 202111162512.4

(51) Int. Cl.
C30B 35/00    (2006.01)
C30B 15/10    (2006.01)
C30B 29/06    (2006.01)

(52) U.S. Cl.
CPC ............ *C30B 15/10* (2013.01); *C30B 35/002* (2013.01); *C30B 29/06* (2013.01)

(58) Field of Classification Search
CPC ....... C30B 15/10; C30B 35/002; C30B 15/00; H01L 21/18
See application file for complete search history.

(56) References Cited

U.S. PATENT DOCUMENTS 4,474,641 A    10/1984    vanRun
6,802,999 B1 *    10/2004    Grugel .................... F27D 21/04
                                                    205/205

(Continued)

FOREIGN PATENT DOCUMENTS

CA    2475212 A1    1/2006
CN    87206316 U    12/1987

(Continued)

OTHER PUBLICATIONS

European Patent Office, English computer translation of JP-61122185 (Year: 2024).*

(Continued)

*Primary Examiner* — Matthew J Song
(74) *Attorney, Agent, or Firm* — Maginot, Moore & Beck LLP

(57) ABSTRACT

A quartz crucible and a crystal puller for growing a crystal ingot are provided. The quartz crucible includes: a crucible base made of silicon dioxide material; and a coating plated on a part of an inner surface of the crucible base, the coating is configured to prevent oxygen atoms of a coated part of the crucible base from precipitating during the growing process of the crystal ingot; a plating area of the coating gradually decreases along a direction from an opening of the crucible base to a bottom of the crucible base.

3 Claims, 6 Drawing Sheets

(56) References Cited

U.S. PATENT DOCUMENTS

| | | | |
|---|---|---|---|
| 2005/0235907 A1 | 10/2005 | Ohama et al. | |
| 2013/0276694 A1 | 10/2013 | Utsuro et al. | |

FOREIGN PATENT DOCUMENTS

| | | | | |
|---|---|---|---|---|
| CN | 101892515 A | | 11/2010 | |
| CN | 102345154 A | | 2/2012 | |
| CN | 202144523 U | | 2/2012 | |
| CN | 203487280 U | | 3/2014 | |
| CN | 107099842 A | | 8/2017 | |
| CN | 208501149 U | | 2/2019 | |
| CN | 110552057 A | | 12/2019 | |
| CN | 110629281 A | | 12/2019 | |
| CN | 211367806 U | | 8/2020 | |
| CN | 112011824 A | | 12/2020 | |
| CN | 113832537 A | | 12/2021 | |
| JP | S5771894 A | | 5/1982 | |
| JP | S61122185 A | * | 6/1986 | ............ C30B 15/10 |
| JP | H0524971 A | | 2/1993 | |
| JP | 2002226291 A | * | 8/2002 | ............ C30B 29/06 |
| JP | 2006021985 A | | 1/2006 | |
| JP | 2013224232 A | | 10/2013 | |
| JP | 2015218087 A | | 12/2015 | |
| KR | 20160084591 A | | 7/2016 | |
| WO | 02070414 A1 | | 9/2002 | |

OTHER PUBLICATIONS

Written Opinion and International Search Report of the International Search Authority corresponding to International Application No. PCT/CN2022/120213, dated Nov. 30, 2022. (10 pages).
English Translation of Written Opinion and International Search Report of the International Search Authority corresponding to International Application No. PCT/CN2022/120213, dated Nov. 30, 2022. (6 pages).
Chinese Office Action corresponding to Chinese Patent Application No. 202111162512.4 dated May 12, 2022. (6 Pages).
English Translation of Chinese Office Action corresponding to Chinese Patent Application No. 202111162512.4 dated May 12, 2022. (1 Page).
Machine Translation of JP2006021985A. (13 Pages).
Machine Translation of CN208501149U. (6 Pages).
Machine Translation of CN203487280U. (10 Pages).
Machine Translation of CN113832537A. (10 Pages).
Machine Translation of CN101892515A. (6 Pages).
Machine Translation of CN87206316U. (2 Pages).
Machine Translation of JP2015218087A. (17 Pages).
Machine Translation of JP2002226291A. (9 Pages).
Machine Translation of CN211367806U. (17 Pages).
Machine Translation of CN202144523U. (17 Pages).
Machine Translation of CN112011824A. (15 Pages).
Machine Translation of CN110629281A. (17 Pages).
Machine Translation of CN110552057A. (17 Pages).
Machine Translation of CN107099842A. (11 Pages).
Machine Translation of CN102345154A. (6 Pages).
Korean Office Action corresponding to Korean Patent Application No. 10-2023-7042881 dated Jan. 18, 2024. (7 Pages).
English Translation of Korean Office Action corresponding to Korean Patent Application No. 10-2023-7042881 dated Jan. 18, 2024. (6 Pages).
Machine English Translation of JPS5771894A. (4 Pages).
Machine English Translation of KR20160084591A. (18 Pages).
Japanese Office Action corresponding to Japanese Patent Application No. 2023-576152 dated Jun. 6, 2024. (4 Pages).
English Translation of Japanese Office Action corresponding to Japanese Patent Application No. 2023-576152 dated Jun. 6, 2024. (4 Pages).
Machine English Translation of JPH0524971A. (10 Pages).
Machine English Translation of JPS61122185A. (4 Pages).

* cited by examiner

QUARTZ CRUCIBLE AND CRYSTAL PULLER

CROSS-REFERENCE TO RELATED APPLICATION

The present application is the U.S. national phase of PCT Application PCT/CN2022/120213 filed on Sep. 21, 2022, which claims priority to the Chinese patent application No. 202111162512.4 filed in China on Sep. 30, 2021, a disclosure of which is incorporated herein by reference in its entirety.

TECHNICAL FIELD

The present disclosure relates to the field of semiconductor silicon wafer production, in particular to a quartz crucible and a crystal puller.

BACKGROUND

Silicon wafers used for the production of semiconductor electronic components such as integrated circuits are mainly manufactured by slicing a single crystal silicon ingot pulled by the Czochralski method. The Czochralski method includes melting polycrystalline silicon in a crucible assembly to obtain a silicon melt, immersing a single crystal seed into the silicon melt, and continuously pulling the seed to move away from the surface of the silicon melt, thereby a single crystal silicon ingot is grown at the phases interface during pulling. When a dopant is added, the melting of the polycrystalline silicon also accompanies the dissolution of the dopant. As the single crystal silicon ingot continues to grow, the melt in the quartz crucible continues to reduce. When the growing of the single crystal silicon ingot is completed, only a small amount of melt remains in the quartz crucible.

SUMMARY

To solve the foregoing technical problems, embodiments of the present disclosure aim to provide a quartz crucible and a crystal puller that can improve the distribution of oxygen concentration in the single crystal silicon ingot.

The technical solution of the present disclosure is implemented as follows:

In a first aspect, an embodiment of the present disclosure provides a quartz crucible for growing a crystal ingot, where the quartz crucible comprises:

a crucible base made of silicon dioxide material; and a coating plated on a part of an inner surface of the crucible base, where the coating is configured to prevent oxygen atoms of a plated part of the crucible base from precipitating during a growing process of the crystal ingot;

where a plating area of the coating gradually decreases along a direction from an opening of the crucible base to a bottom of the crucible base.

In a second aspect, an embodiment of the present disclosure provides a crystal puller, comprising the quartz crucible according to the first aspect.

DETAILED DESCRIPTION

The technical solutions in the embodiments of the present disclosure will be clearly and completely described below with reference to the accompanying drawings in the embodiments of the present disclosure.

In the related art, the quartz crucible produces silicon atoms and oxygen atoms at high temperatures. The oxygen atoms melt into the silicon melt and react with the silicon atoms in the silicon melt to form silicon dioxide gas volatiles. As the crystal growing process continues, the quartz crucible continues to react with the melt and become thinner. However, the oxygen concentration in the single crystal silicon ingot is not uniform and is often high at the head part and low at the tail part. The reason for this situation is that the segregation coefficient of oxygen is approximately equal to 1, and thus the distribution of oxygen in solid and melt is almost the same. But with the continuous reduction of the melt in the crucible during the crystal growing process, the contact area between the melt and the quartz crucible gradually decreases so that the oxygen precipitated from the inner surface of the quartz crucible during the crystal growing process cannot be uniformly distributed in the melt. The oxygen concentration in the grown single crystal silicon ingot is also uneven, and there is a situation where the oxygen distribution in the single crystal silicon ingot is high at the head part and low at the tail part. This affects the uniformity of oxygen precipitates or so-called bulk micro defects (BMD) in the silicon wafer during subsequent processing.

Figure 1:
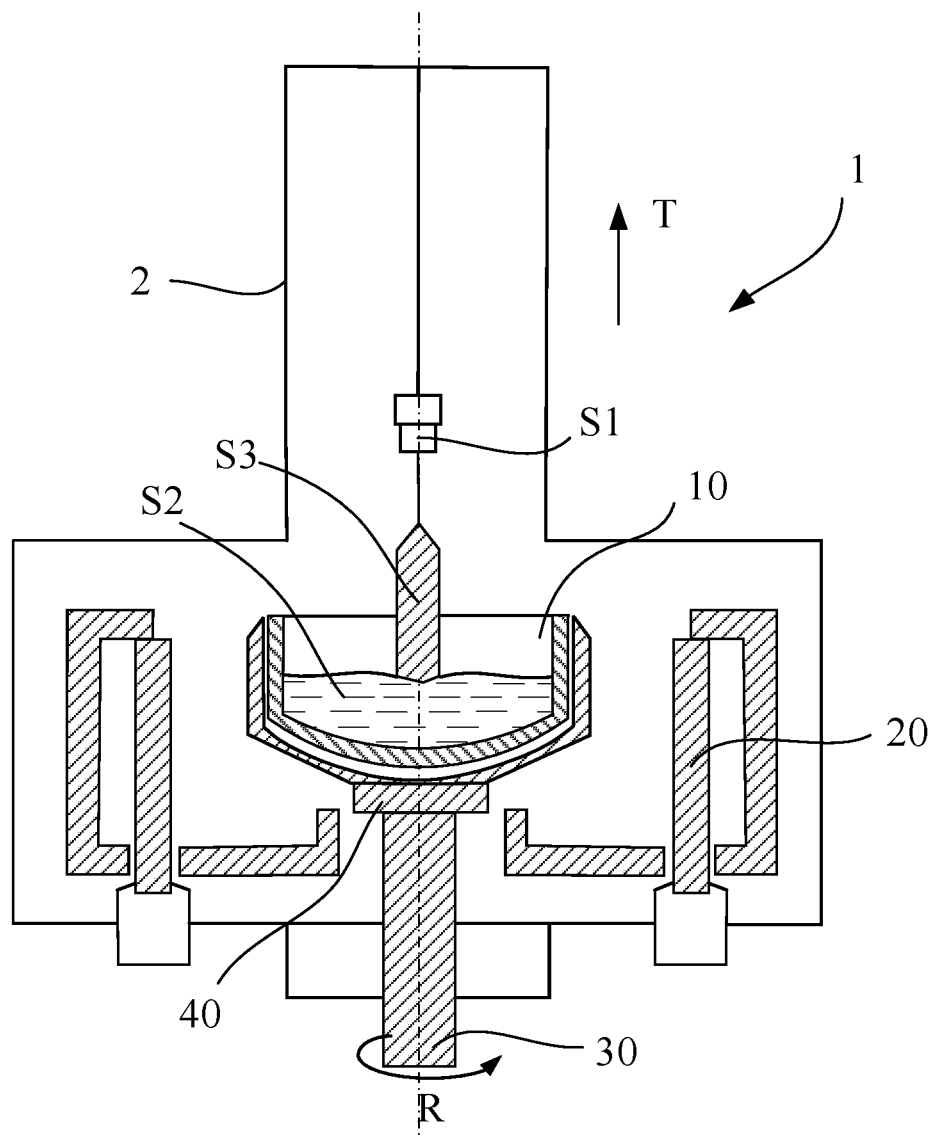
FIG. 1 is a schematic view of an implementation of a conventional crystal puller.
Figure 2:
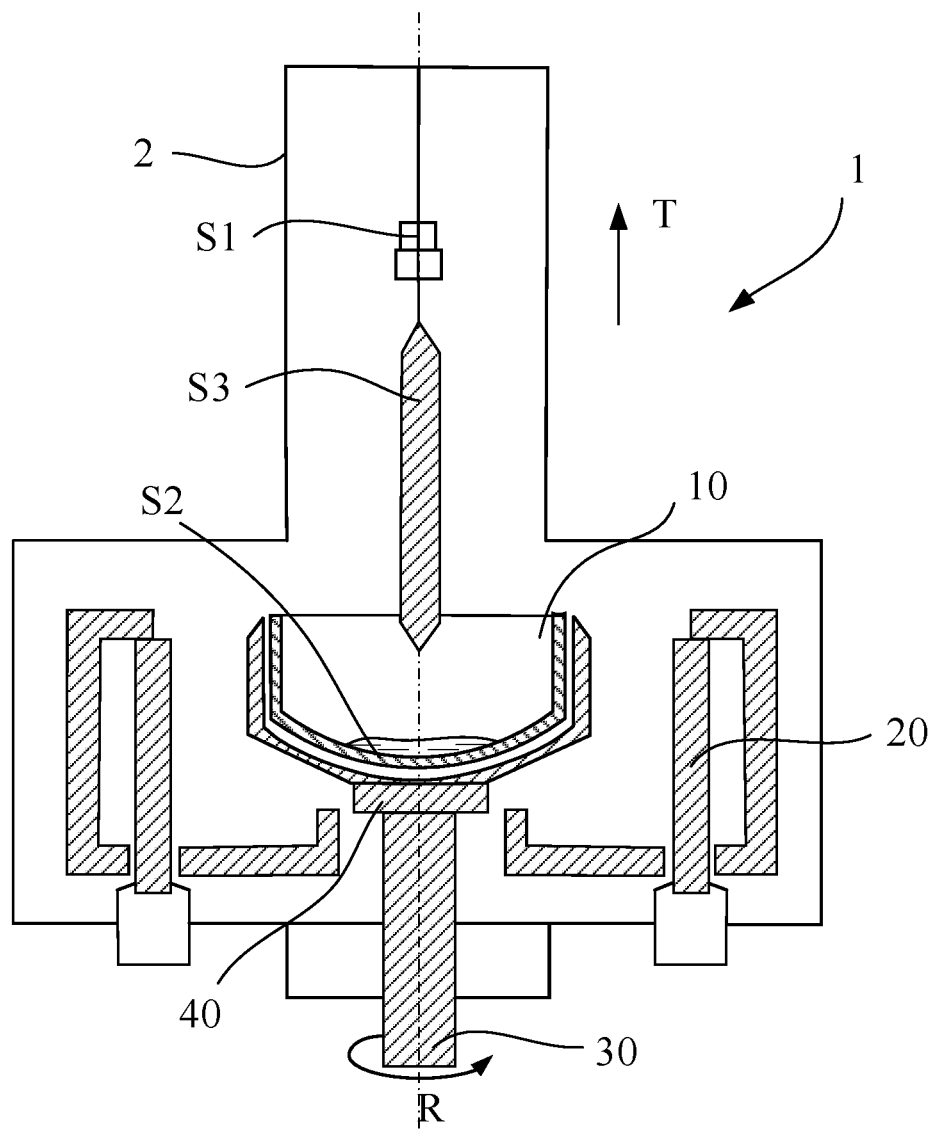
FIG. 2 is another schematic view of the conventional crystal puller in FIG. 1.

Referring to FIG. 1 and FIG. 2, FIG. 1 and FIG. 2 show an implementation of a conventional crystal puller. As shown in FIG. 1, the crystal puller 1 comprises: a puller chamber surrounded by a shell 2, a quartz crucible 10, a graphite heater 20, a crucible rotating mechanism 30, and a crucible supporting apparatus 40 arranged in the puller chamber. The quartz crucible 10 is supported by the crucible supporting apparatus 40, and the crucible rotating mechanism 30 is located below the crucible supporting apparatus 40 and is configured to drive the quartz crucible 10 to rotate around its own axis in the direction R.

When a single crystal silicon ingot is grow by using the crystal puller, first, high-purity polycrystalline silicon feedstock is put into the quartz crucible 10, and the quartz crucible 10 is continuously heated by the graphite heater 20 while the crucible rotating mechanism 30 drives the quartz crucible 10 to rotate in the direction R, so as to melt the polycrystalline silicon feedstock contained in the quartz crucible 10 into a molten state, that is, melted into a melt S2. The heating temperature is maintained at about one thousand degrees Celsius, the gas in the puller is usually an inert gas, which melts the polycrystalline silicon without producing unnecessary chemical reactions. When the liquid surface temperature of the melt S2 is controlled at the critical point of crystallization by controlling the thermal field provided by the graphite heater 20, the single crystal seed S1 located on the melt surface is pulled upward along the direction T from the melt surface, and a single crystal silicon ingot S3 is grow from the melt S2 with the crystal orientation as the same as the single crystal seed S1 by the single crystal seed S1 is pulled up.

As the crystal growing process proceeds, the melt S2 gradually decreases. As shown in FIG. 2, when the growing process ends and the single crystal silicon ingot S3 is completely separated from the melt S2, only a small amount of melt S2 remains in the quartz crucible 10. Since the melt S2 gradually decreases during the crystal growing process, the contact area between the melt S2 and the quartz crucible 10 also gradually reduces, which will lead to uneven oxygen concentration in the single crystal silicon ingot S3, with a situation that the oxygen concentration is high at the head part and low at the tail part.

In order to make the oxygen concentration in the single crystal silicon ingot S3 uniform, an embodiment of the present disclosure proposes a quartz crucible. Specifically, referring to FIG. 3, an embodiment of the present disclosure provides a quartz crucible 10' for growing a crystal ingot, where the quartz crucible 10' comprises:

a crucible base DE made of silicon dioxide material; and
a coating LA plated on a part of an inner surface of the crucible base DE, where the coating LA is configured to prevent oxygen atoms of a plated part of the crucible base DE from precipitating during the growing process of the crystal ingot;
a plating area of the coating LA gradually reduces along a direction from an opening OP of the crucible base to a bottom BO of the crucible base.

Embodiments of the present disclosure provide a quartz crucible and a crystal puller for producing a single crystal silicon ingot. By coating a part of the inner surface of the quartz crucible, the precipitation of oxygen atoms of this part can be prevented. Since the plating area of the coating gradually reduces along the direction from the opening of the crucible base to the bottom of the crucible base, the oxygen atoms precipitated from the quartz crucible gradually increase during the crystal growing process. That is to say, when the crystal growing starts, although there is a large amount of melt in the quartz crucible at this time, due to the existence of the coating LA, the contact area between the melt and the quartz crucible 10' is reduced compared to the contact area between the melt and the conventional quartz crucible. This also reduces the oxygen concentration in the head part of the single crystal silicon ingot that the first grown compared to the head part of the single crystal silicon ingot grown using a conventional quartz crucible. As the crystal growing process continues, the reduction of the plating area of the coating LA allows the melt to gradually come into full contact with the quartz crucible 10', therefore, the oxygen concentration in the grown single crystal silicon ingot tends to be close to the oxygen concentration in the single crystal silicon ingot grown using a conventional quartz crucible, thereby achieving the purpose of making the overall distribution of the oxygen concentration of the single crystal silicon ingot uniform.

For the implementation form of the coating LA, optionally, the coating LA is distributed on the inner surface of the crucible base DE in a form of a plurality of coating strips PT spaced apart from each other.

Figure 3:
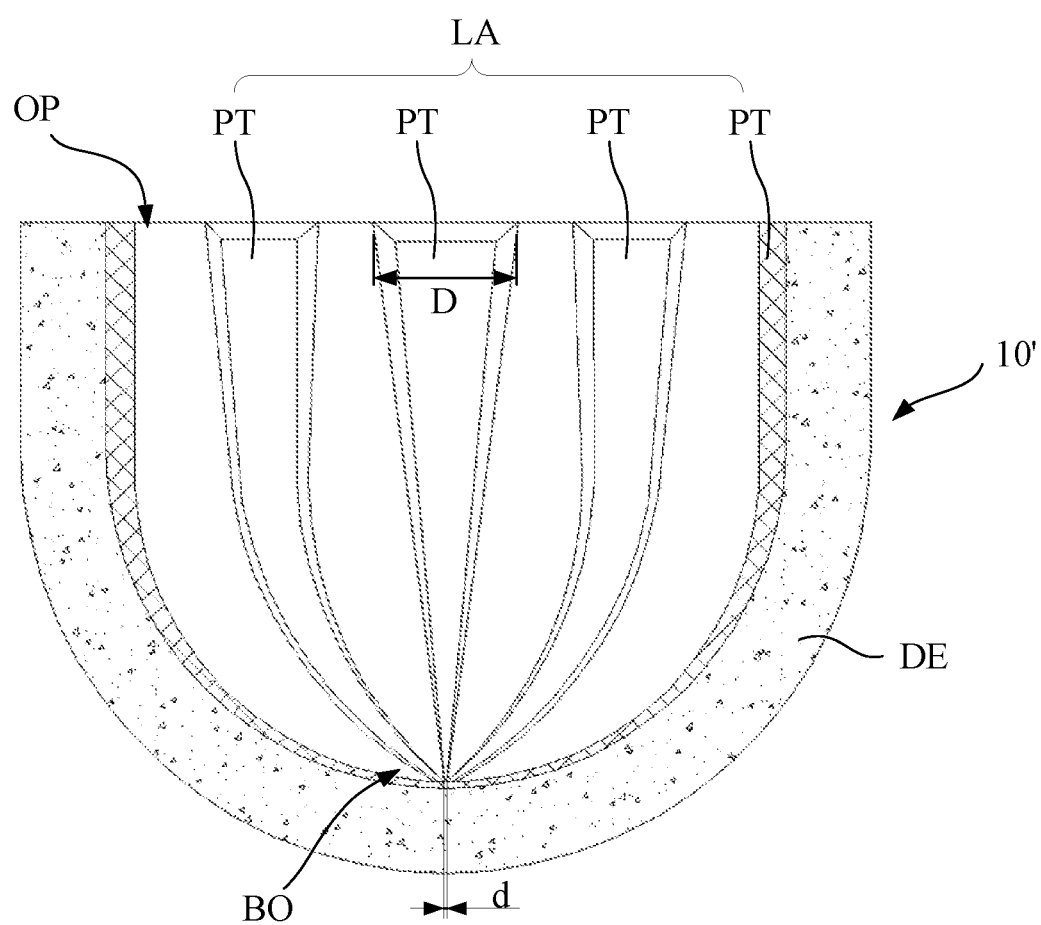
FIG. 3 is a schematic view of a quartz crucible according to an embodiment of the present disclosure.

In one embodiment of the present disclosure, optionally, referring FIG. 3, each of the plurality of coating strips PT extends downward along the inner surface from the opening OP of the crucible base DE to the bottom BO of the crucible base DE, where the width of each coating strip gradually decreases along the inner surface from the opening OP of the crucible base downward.

Specifically, as shown in FIG. 3, the width D of each coating strip at the opening of the crucible base is greater than the width d at the bottom of the crucible base.

Figure 4:
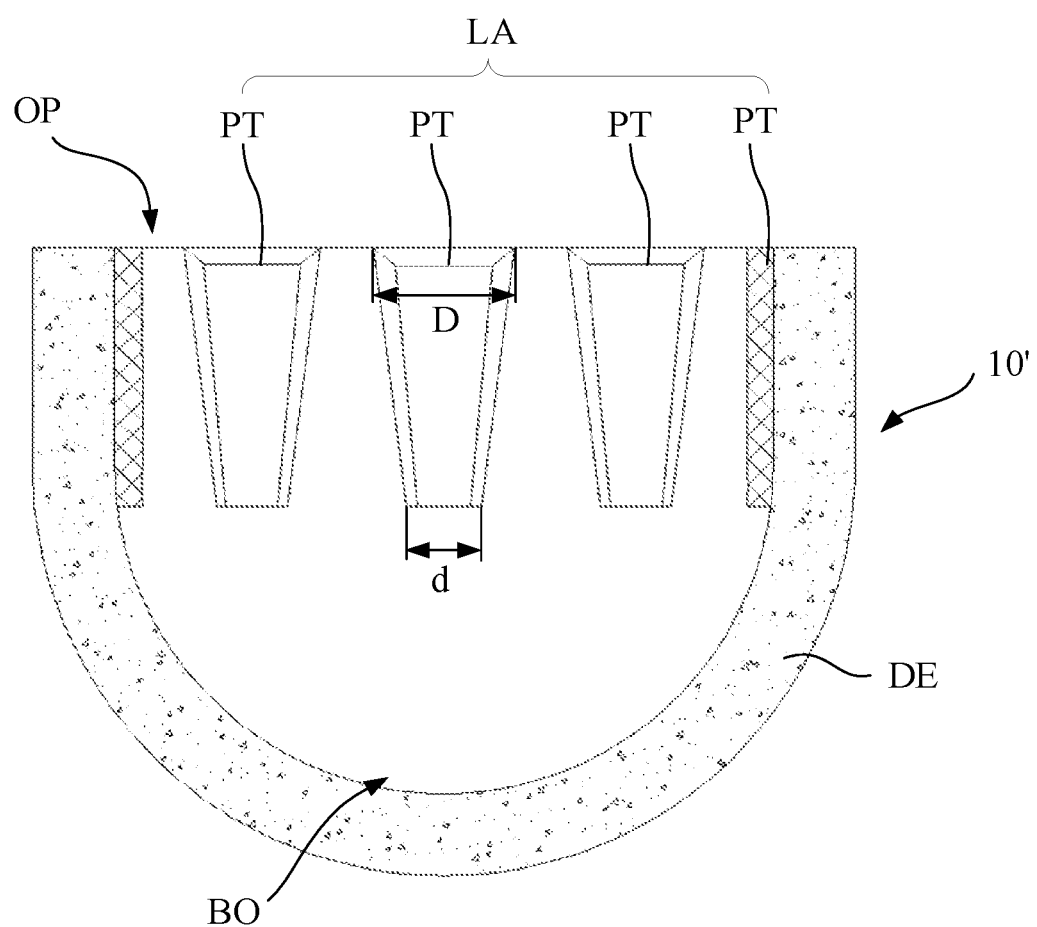
FIG. 4 is a schematic view of a quartz crucible according to another embodiment of the present disclosure.

In another embodiment of the present disclosure, optionally, as shown in FIG. 4, each of the plurality of coating strips PT extends downward along the inner surface from the opening OP of the crucible base DE to a middle position in a vertical direction of the crucible base DE. That is to say, in the embodiment shown in FIG. 4, only the upper half of the inner surface of the crucible base DE is provided with a coating LA.

For the coating that is only arranged on the upper half of the inner surface of the crucible base, optionally, the width of the at least one of the plurality of coating strips gradually reduces along the inner surface from the opening of the crucible base downward.

Optionally, as shown in FIG. 4, the width D of each coating strip PT at the opening OP of the crucible base is greater than the width d at the middle of the crucible base DE.

In the embodiments shown in FIG. 2 to FIG. 4, the coating LA is in the form of a plurality of coating strips longitudinally arranged on the inner surface of the crucible base DE. And at the positions where the coating strips are arranged, the quartz crucible is unable to react with the melt. That is to say, compared with the conventional quartz crucible, at least when there is a large amount of melt, the contact area between the quartz crucible provided by the embodiments of the present disclosure and the melt is reduced. Therefore, the oxygen concentration decreased during the growing stage of the head part of the single crystal silicon ingot.

Figure 5:
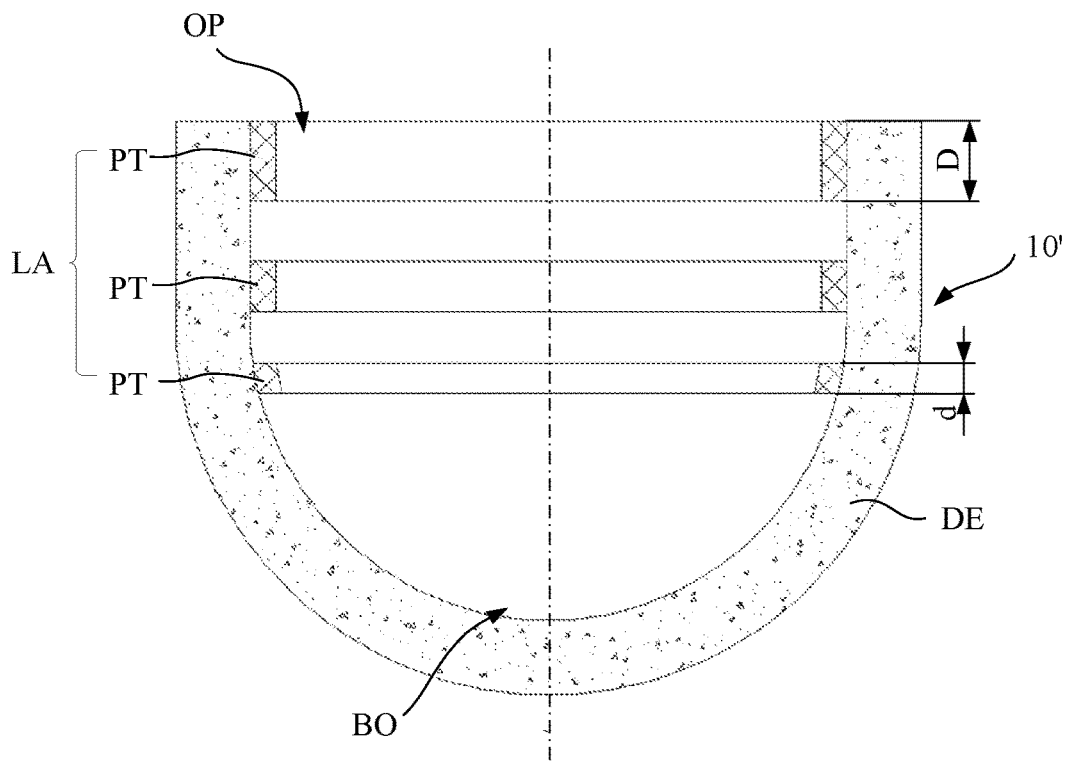
FIG. 5 is a schematic view of a quartz crucible according to another embodiment of the present disclosure.

It should be pointed out that the arrangement of the coating strips is not limited to the foregoing embodiments. In another optional embodiment, as shown in FIG. 5, each of the plurality of coating strips PT is in a ring shape, where the centerline of the ring shape coincides with the rotation axis of the crucible base, and the width of each of the plurality of coating strips PT gradually reduces along the direction from the opening of the crucible base to the bottom of the crucible base. As shown in FIG. 5, the width D of the coating strip PT near the opening OP of the crucible base is greater than the width d of the coating strip PT at the middle of the crucible base.

In order to produce silicon wafers with high-density bulk micro defects (BMD), it is very beneficial to dope silicon wafers with nitrogen. For example, when silicon wafers doped with nitrogen, it can promote the formation of BMD with nitrogen as the core, so that the density of BMD can reach a certain level to effectively play a role as a source for absorbing metal impurity of metal adsorption source, and also can have a beneficial effect on the distribution of the density of BMD, such as the distribution of the density of BMD is more uniformly in the radial direction of the silicon wafers. As an implementation to dope silicon wafers with nitrogen, the silicon melt in the quartz crucible can be doped with nitrogen, so the single crystal silicon ingot pulled therefrom and the silicon wafer cut from the single crystal silicon ingot are doped with nitrogen.

In view of the above, optionally, the coating plated on the quartz crucible provided by the embodiment of this application is a silicon nitride film. As a result, not only the direct contact between the melt and a part of the inner surface of the crucible base is prevented, but also the nitrogen doping of the single crystal silicon ingot is facilitated, thereby further promoting the uniformity of the oxygen concentration in the single crystal silicon ingot.

Figure 6:
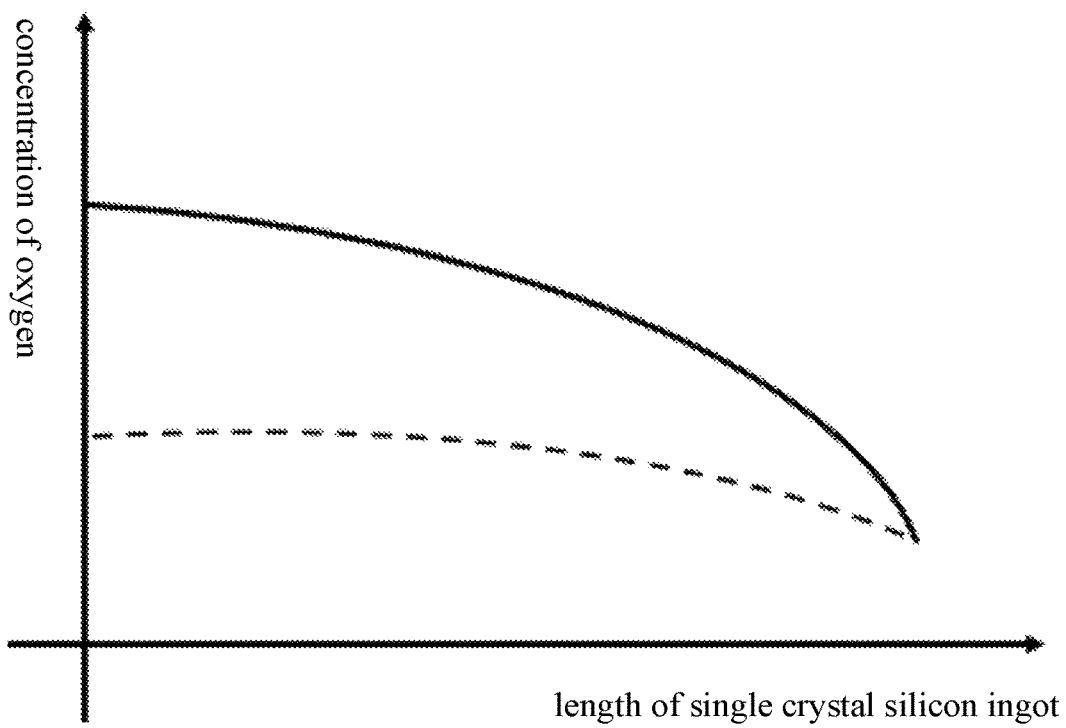
FIG. 6 is a curve diagram showing the relationship between the oxygen concentration and the length of a single crystal silicon ingot in a single crystal silicon ingot grown using a conventional quartz crucible and a single crystal silicon ingot grown using a quartz crucible provided by an embodiment of the present disclosure.

The single crystal silicon ingot grown using the quartz crucible provided by the embodiments of the present disclosure has a more uniform oxygen concentration compared to that using a conventional quartz crucible. Specifically, referring to FIG. 6, FIG. 6 is a curve diagram showing the relationship between the oxygen concentration and the length of a single crystal silicon ingot in a single crystal silicon ingot grown using a conventional quartz crucible and a single crystal silicon ingot grown using a quartz crucible provided by an embodiment of the present disclosure. The solid line represents the situation of the single crystal silicon ingot grown using a conventional quartz crucible, and the dashed line represents the situation of the single crystal silicon ingot grown using the quartz crucible provided by an embodiment of the present disclosure. By comparison, it can be seen that the oxygen concentration in the single crystal silicon ingot grown using the quartz crucible provided by an embodiment of the present disclosure does not change significantly as the increase in the length of the single crystal silicon ingot, that is, overall, the oxygen concentration of the single crystal silicon ingot is relatively uniform.

Figure 7:
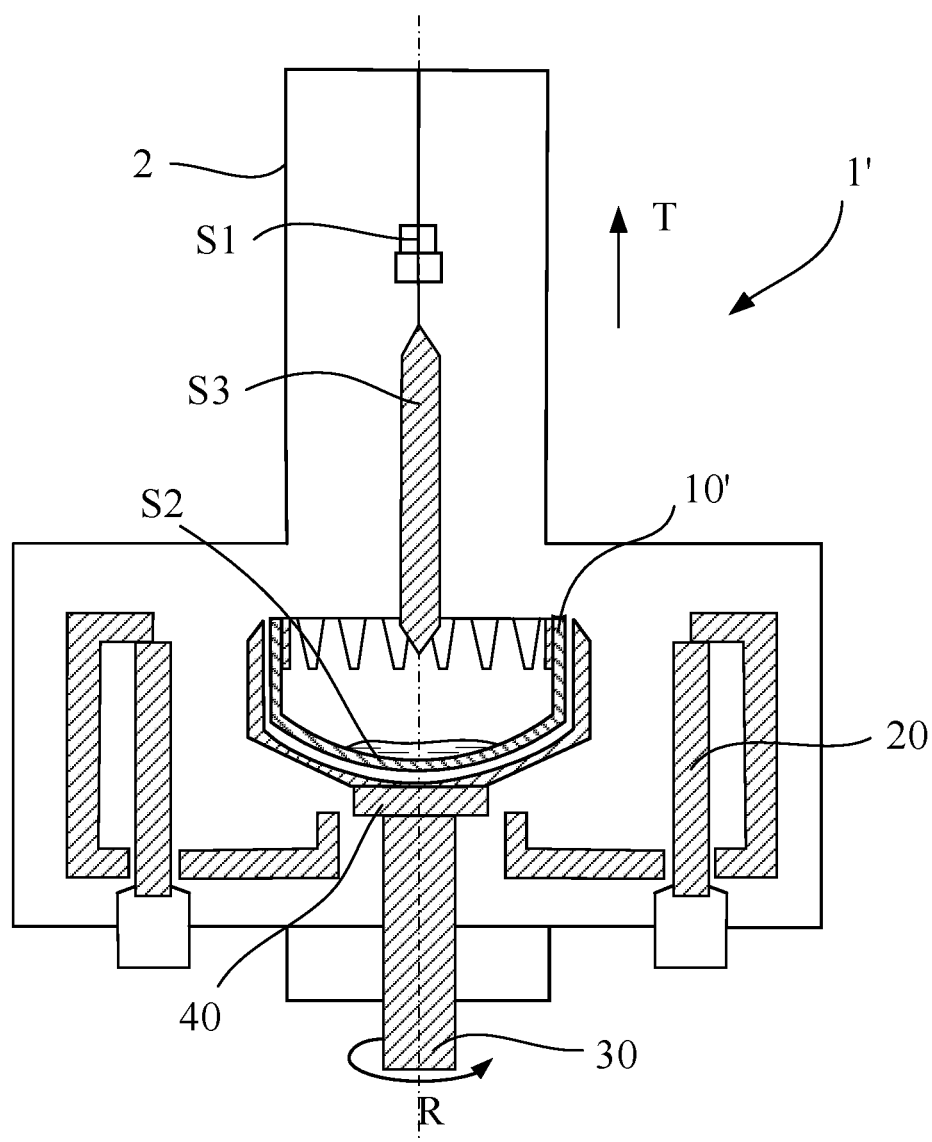
FIG. 7 is a schematic view of a crystal puller according to an embodiment of the present disclosure.

Referring to FIG. 7, an embodiment of the present disclosure further provides a crystal puller 1'. The difference from the conventional crystal puller is that the crystal puller 1' comprises a quartz crucible 10' provided according to the foregoing embodiments of the present disclosure.

It should be noted that the technical solutions described in the embodiments of the present disclosure may be combined arbitrarily without conflict.

The above are only specific implementations of the present disclosure, but the protection scope of the present disclosure is not limited to this. Changes or substitutions which could be conceived of by a person skilled in the art can easily think will fall within the technical scope disclosed in the present disclosure. Therefore, the protection scope of the present disclosure should be subject to the protection scope of the claims.

What is claimed is:

1. A quartz crucible for growing a crystal ingot, comprising:
   a crucible base made of silicon dioxide material; and
   a coating plated on a part of an inner surface of the crucible base, wherein the coating is configured to prevent oxygen atoms of a plated part of the crucible base from precipitating during a growing process of the crystal ingot;
   wherein a plating area of the coating gradually reduces along a direction from an opening of the crucible base to a bottom of the crucible base,
   wherein the coating is distributed on the inner surface of the crucible base in a form of a plurality of coating strips spaced apart from each other, and
   wherein each of the plurality of coating strips is in a ring shape, a centerline of the ring shape coincides with a rotation axis of the crucible base, and a width of each of the coating strips gradually reduces along a direction from the opening of the crucible base to the bottom of the crucible base.

2. The quartz crucible according to claim 1, wherein the coating is a silicon nitride film.

3. A crystal puller, comprising the quartz crucible according to claim 1.

* * * * *